(12) United States Patent
Rivoir

(10) Patent No.: US 7,230,556 B2
(45) Date of Patent: Jun. 12, 2007

(54) ANALOG SIGNAL GENERATION USING A DELTA-SIGMA MODULATOR

(76) Inventor: Jochen Rivoir, P.O. Box 7599, Loveland, CO (US) 80537-0599

( * ) Notice: Subject to any disclaimer, the term of this patent is extended or adjusted under 35 U.S.C. 154(b) by 16 days.

(21) Appl. No.: 11/197,252

(22) Filed: Aug. 4, 2005

(65) Prior Publication Data

US 2006/0028364 A1    Feb. 9, 2006

(30) Foreign Application Priority Data

Aug. 6, 2004   (EP)   ................... 04103817

(51) Int. Cl.
*H03M 3/00*   (2006.01)
(52) U.S. Cl. .............. 341/143; 341/120; 341/144
(58) Field of Classification Search ................ 341/143
See application file for complete search history.

(56) References Cited

U.S. PATENT DOCUMENTS

| | | | |
|---|---|---|---|
| 5,453,995 A | 9/1995 | Behrens | |
| 5,499,248 A | 3/1996 | Behrens et al. | |
| 5,548,286 A * | 8/1996 | Craven | ............... 341/126 |
| 6,150,969 A * | 11/2000 | Melanson | ............... 341/143 |
| 6,249,237 B1 * | 6/2001 | Prater | ............... 341/143 |
| 6,404,369 B1 | 6/2002 | Sheen | |
| 6,414,614 B1 * | 7/2002 | Melanson | ............... 341/143 |
| 6,819,276 B1 * | 11/2004 | Hossack | ............... 341/143 |
| 6,888,484 B2 * | 5/2005 | Kiss et al. | ............... 341/143 |
| 6,946,983 B2 * | 9/2005 | Andersson et al. | ............... 341/118 |

FOREIGN PATENT DOCUMENTS

| | | |
|---|---|---|
| EP | 0859318 A1 | 8/1998 |
| EP | 0864977 A1 | 9/1998 |
| EP | 0882991 A1 | 12/1998 |
| EP | 0886214 A1 | 12/1998 |
| EP | 1092983 A1 | 4/2001 |
| WO | WO 03/092164 A2 | 6/2003 |

OTHER PUBLICATIONS

T. Cataltepe et al., "Digitally Corrected Multi-bit Sigma Delta Data Converters", IEEE International Symposium on Circuits and Systems, May 8, 1989, pp. 647-650.
EP Search Report, Sep. 10, 2004.

* cited by examiner

*Primary Examiner*—Khai M. Nguyen
(74) *Attorney, Agent, or Firm*—Perman & Green, LLP

(57) ABSTRACT

A method for generating an analog signal based on samples representing the analog signal includes feeding the samples into a delta-sigma modulator, the delta-sigma modulator outputting a sequence of bits, and introducing a non-linear time-discrete function into a feedback loop between a quantizer element and a delta element of the delta-sigma modulator, where arguments of the non-linear time-discrete function include a current bit and at least one bit previous to the current bit.

8 Claims, 5 Drawing Sheets

ANALOG SIGNAL GENERATION USING A DELTA-SIGMA MODULATOR

BACKGROUND OF THE INVENTION

The present invention relates to an improvement of signal integrity of analog signals based on the output of a delta-sigma modulator into which samples of the analog signal to be generated are fed.

It is known from prior art to use a delta-sigma modulator followed by a driver circuit and a filter and thus forming a delta-sigma digital-to-analog converter. Due to noise and circuit non-idealities the analog signal generated this way will always deviate from the ideal analog signal.

The filter following the delta-sigma modulator averages the bit stream of the mentioned driver and for an ideal signal integrity the contribution of each "high"-bit of the bit stream to the output signal must be equal, and the contribution of each "low"-bit of the bit stream to the output signal must be equal. However, memory effects in the driver circuit, known as inter symbol interference (ISI), affect—dependent upon history of previous bits—the pulse form of a bit and thus the contribution of this bit to the averaging process by the mentioned filter. Settling time, slew-rate limitations, unequal rise-/fall-times and ringing are contributing to the inter symbol interference.

The present invention relates also to improvements in the evaluation of a Device Under Test (DUT) in response to an input signal provided by an Automated Test Equipment (ATE) to said DUT, said input signal having improved integrity according to the inventive method and system.

Integrated Circuits (IC) generally need to be tested to assure proper operation. This—in particular—is required during IC development and manufacturing. In the latter case, the ICs are usually tested before final application. During test, the IC, as Device Under Test (DUT), is exposed to various types of stimulus signals, and its responses are measured, processed and usually compared to an expected response of a good device. Automated Test Equipments (ATE) usually perform these tasks according to a device-specific test program. Examples for ATE are the Agilent 83000 and 93000 families of Semiconductor Test Systems of Agilent Technologies Details are also disclosed e.g. in EP-A-859318, EP-A-864977, EP-A-886214, EP-A-882991, EP-A-1092983, US-A-5,499,248, US-A-5,453,995.

The present invention also relates to general test equipment as well as all types of analog signal generation.

Improving signal integrity by higher sampling rates or increasing the resolution of delta-sigma digital-to-analog converters is possible, however the known issue of inter symbol interference is not addressed by this kind of modifications.

SUMMARY OF THE INVENTION

It is an object of the invention to improve signal integrity of delta-sigma digital-to-analog converters. It is a further object of the invention to reduce the effect of inter symbol interference (ISI).

The objects are achieved as defined by the independent claims. Further embodiments are defined by the dependent claims.

The objects are achieved by modifying the feedback loop of said delta-sigma modulator, more particular, by introducing a non-linear, time-discrete function modeling the effect of inter signal interference (ISI) using a model initially based on measurement or simulation. In an embodiment of the present invention a method is provided of optimizing the mentioned non-linear, time-discrete function i.e. optimizing the mentioned model for best signal integrity of an output signal.

Modeling the effects of inter-signal interference (ISI) result in a non-linear, time-discrete function, which may be presented by a look-up table comprising arguments and values of said non-linear, time-discrete function. Dependent upon the current and previous bits the look-up table will supply a value to be used within a feedback loop of the delta-sigma modulator. One goal of this compensation is the equality of the contribution to the output signal of the delta-sigma modulator digital-to-analog converter of each "high"-bit and the equality of the contribution to the output of the delta-sigma modulator digital-to-analog converter of each "low"-bit.

In a first step, the contribution of a current bit value under conditions which are different depending upon the history of previous bits is measured and/or simulated in order to determine initial values of the non-linear, time-discrete function. Accordingly, the arguments of the non-linear, time-discrete function comprise the current bit and at least one bit previous to the current bit. In a second step, the initial values are optimized. The second step uses the initial values to generate a predetermined waveform, for example a sine wave, with a delta-sigma modulator digital-to-analog converter. Afterwards the deviation of the generated analog signal from the ideal signal is evaluated, e.g. harmonics of a generated sine wave are measured and the values of the non-linear, time-discrete function in the look-table are optimized for best analog signal integrity, e.g. for best suppression of harmonics in the case of a sine wave.

The feedback loop of a delta-sigma modulator according to the present invention includes the non-linear, time-discrete function, e.g. as represented by the look-up table. The current output bit and at least one bit previous to the respective current bit of the delta-sigma modulator represent the arguments of the non-linear, time-discrete function. The values of previous bits are provided by serially connected delay elements. In a software realization of a delta-sigma modulator the inventive feedback loop requires no additional latency, and thus corresponding destabilization of the modulator can be avoided.

In a multi-bit delta-sigma digital-to-analog converter for at least two, preferably for each driver, an individual non-linear, time-discrete function is introduced and thus compensation within the feedback loop will be done individually for each respective driver.

The implementation of the method described within this disclosure may be either in hardware or in software. Instead of a low-pass delta-sigma digital-to-analog converter a band-pass delta-sigma digital-to-analog converter may be used in conjunction with the present invention.

The inventive method can be used for generating analog signals with high signal integrity provided by an ATE to a DUT. Thus the performance evaluation of the DUT is more reliable.

The present invention also relates to a software program or product for executing the method for generating an analog signal when running on a data processing system such as a computer. Preferably, the program or product is stored on a data carrier.

Furthermore, the present invention relates to a system generating an analog signal according to the present invention.

BRIEF DESCRIPTION OF THE DRAWINGS

Other objects and many of the attendant advantages of the present invention will be readily appreciated and become better understood by reference to the following description, taken in conjunction with the accompanying drawings, in the several figures of which like reference numerals identify like elements, and in which:

FIG. 1 shows the main components of a single-bit delta-sigma digital-to-analog converter 1 without the inventive modification in the feedback loop. A single-bit delta-sigma modulator 2 is followed by a driver 3 and a low pass filter 4. In a lower part of FIG. 1 an expanded view of the single-bit delta-sigma modulator 2 is shown, comprising a difference amplifier element representing a delta element 6 of the delta-sigma modulator 2, a loop filter 7, an adder 8 representing a sigma element of the delta-sigma modulator 2, a single-bit quantizer 9, a feed-forward line 95 and a feedback line 96.

The desired analog signal is represented by a sequence of samples x[k] at the input of the delta-sigma modulator 2. At the output of the delta-sigma modulator 2 a quantized pulse density modulated signal q[k] is provided which is fed into driver 3 and the output signal D(t) of driver 3 is fed into the low pass filter 4. At the output of the low pass filter 4 the generated analog signal x(t) is available.

Figure 2:
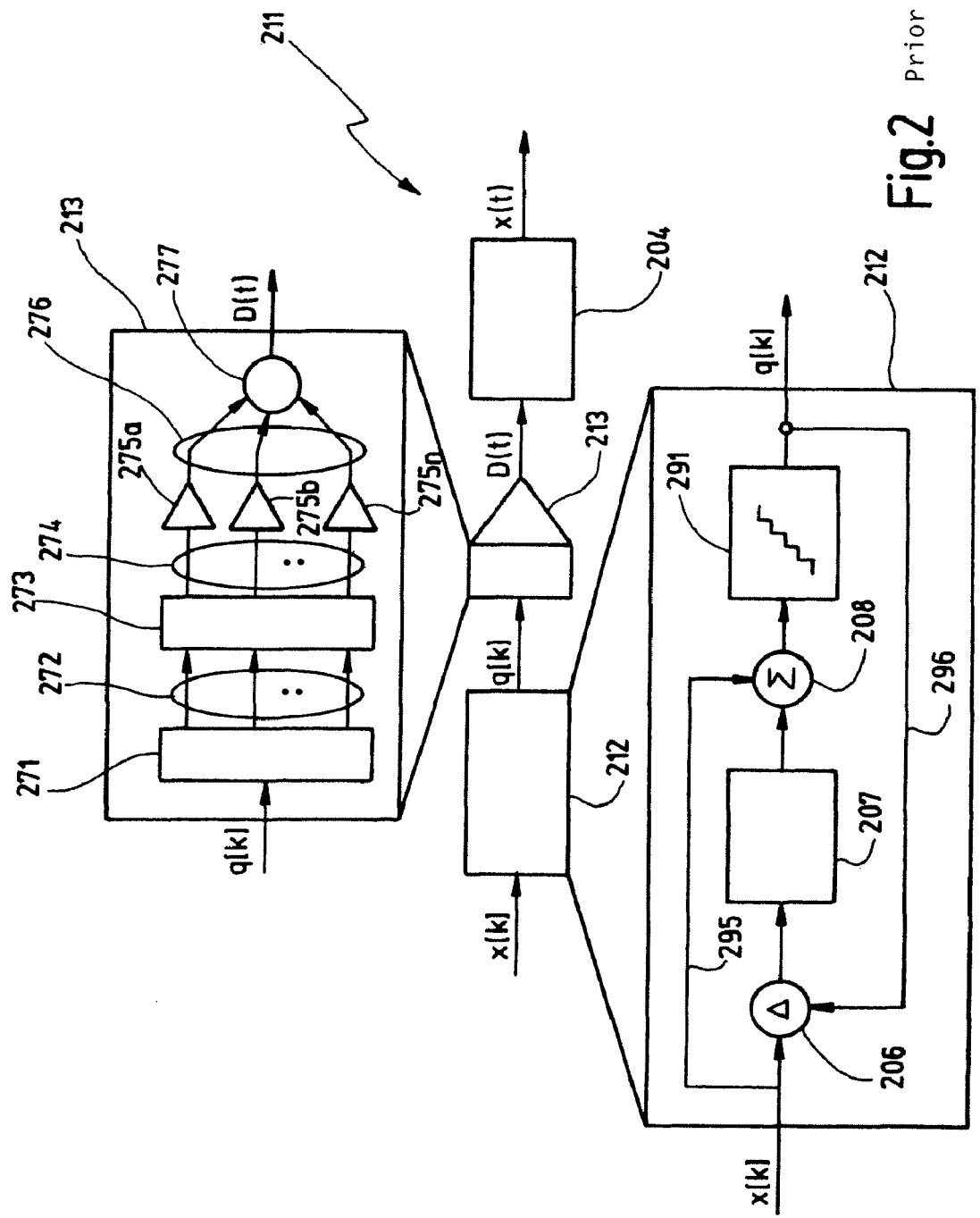
FIG. 2 shows the main components of a multi-bit delta-sigma digital-to-analog converter without the inventive modification in the feedback loop.

FIG. 2 shows the main components of a multi-bit delta-sigma digital-to-analog converter 211 without the inventive modification in the feedback loop. The multi-bit delta-sigma digital-to-analog converter 211 comprising the main building blocks of a multi-bit delta-sigma modulator 212, a multi-bit digital-to-analog converter 213 and a low pass filter 204. In a lower part of FIG. 2 an expanded view of the multi-bit delta-sigma modulator 212 is shown. In an upper part of FIG. 2 an expanded view of the multi-bit digital-to-analog converter 213 is shown, which is preferably realized as a flash digital-to-analog converter with dynamic element matching (DEM).

Figure 1:
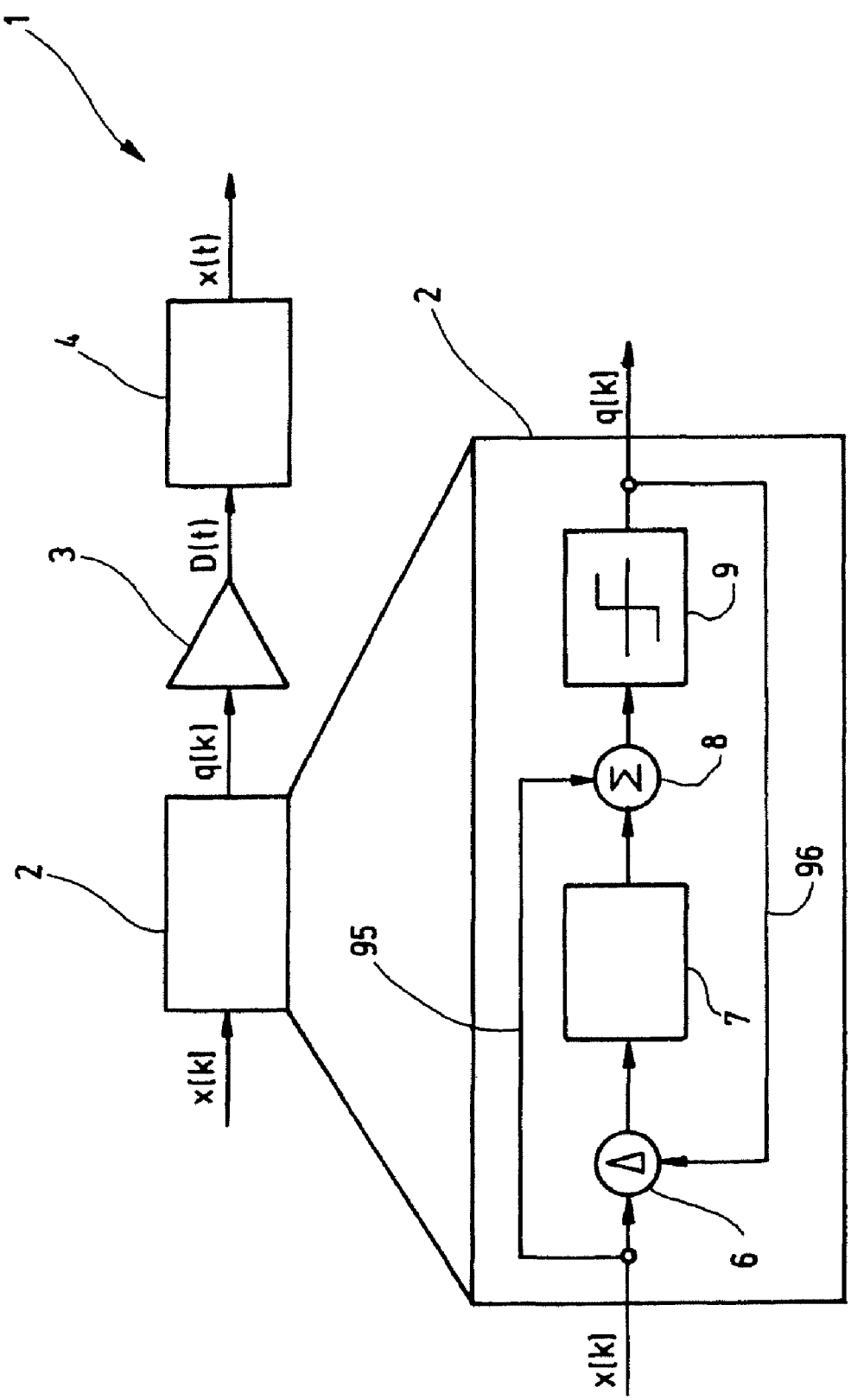
FIG. 1 shows the main components of a single-bit delta-sigma digital-to-analog converter without the inventive modification in the feedback loop.

The multi-bit delta-sigma modulator 212 comprises a difference amplifier element 206, a loop filter 207 and an adder 208 as well as feedback line 296 and a feed-forward line 295 like known from FIG. 1. In the case of the multi-bit delta-sigma digital-to-analog converter 211 shown in FIG. 2 the quantizer 291 is a multi-bit quantizer. As can be seen from the expanded view of the multi-bit digital-to-analog converter 213 it comprises a decoder 271 with output lines 272 feeding a scrambler 273. Output lines 274 of the scrambler 273 are fed into the driver inputs 275a, 275b . . . 275n. The output lines 276 of the drivers 275a, 275b, . . . 275n are followed by an adder 277.

The desired analog signal is represented by a sequence of samples x[k] at the input of the delta-sigma modulator 212. At the output of the delta-sigma modulator 212 a quantized pulse density modulated signal q[k] is provided which is fed into digital-to-analog converter 213 and the output signal D(t) of digital-to-analog converter 213 is fed into the low pass filter 204. At the output of the low pass filter 204 the generated analog signal x(t) is available.

Figure 3:
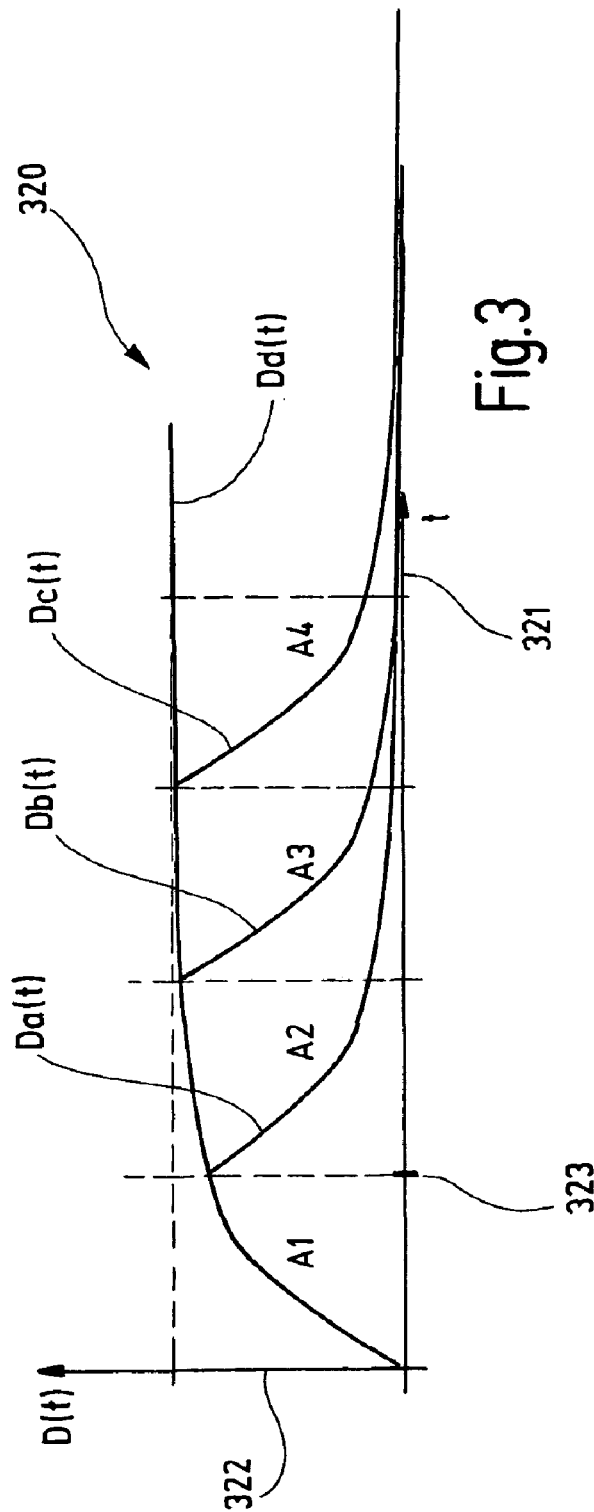
FIG. 3 shows a diagram illustrating areas under bits.

FIG. 3 shows a diagram illustrating the areas under bits. The x-axis 321 is used to lay off time t and a bit period is marked by the unit marker 323. Dotted lines parallel to the y-axis 322 mark the begin and end of bit periods. The y-axis 322 shows qualitatively the signal level of signal D(t). A1, A2, A3 and A4 designate the areas under four consecutive bits. The low pass filter 4, as for example shown in FIG. 1 averages the bit stream of a driver 3 in FIG. 1.

FIG. 3 shows a diagram 320 of four possible waveforms Da(t) to Dd(t) of the output signal D(t) of the driver 3 for sequences of bits q[k] fed into the input of the driver 3. Time t is layed off as the x-axis 321 and the unit of one bit period 323 is marked. The level of the waveforms Da(t) to Dd(t) is layed off as the y-axis 322. The first waveform Da(t) results from a sequence "1-0" wherein the value is "1" within the first bit period A1. The second waveform Db(t) results from a sequence "1-1-0" wherein the value is "1" within the first and second bit periods A1 and A2. The third waveform Dc(t) results from a sequence "1-1-1-0" wherein the value is "1" within the first to third bit periods A1 to A3. The fourth waveform Dd(t) results from a sequence "1-1-1-1-0" wherein the value is "1" within the first to fourth bit periods A1 to A4. For t<0 it is assumed that the value has been "0" for a long time.

As can be seen from FIG. 3 the contribution of a bit value "1" to the output signal D(t) of driver 3 depends on the history of previous bits. The contribution of the bit value "1" in the second period A2 within the signal Db(t) differs from the contribution of the bit value "1" in the first period A1 within the signal Db(t).

For ideal signal integrity the contribution of bit values "1" should be independent upon the history of previous bits. Thus it is advantageous if for same bit values "1" or "0" areas under the waveform of driver output signal D(t) within a bit period are equal, independent upon the history of previous bits. However, memory effects in drivers also known as inter symbol interference (ISI), make pulse form of one bit and thus area under pulse or bit dependent upon history of previous bits. Effects that are contributing to inter symbol interference are for example settling time, slew-rate limitations, unequal rise-/fall-times and ringing.

Figure 4:
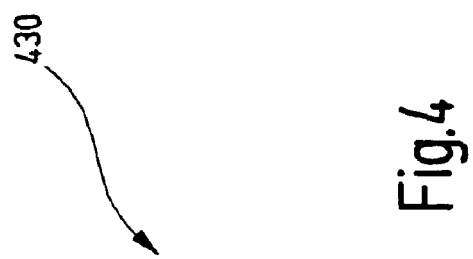
FIG. 4 contains a table for model having a history of two bits.

FIG. 4 shows a tabular representation 430 of an example of a non-linear time-discrete function used for compensation in the modified feedback loop of embodiments of the present invention for the case of a history of two previous bits q[k-1] and q[k-2] taken into account. The values given for a[k] in FIG. 4 are chosen only for demonstration. A tendency can be recognized in a way that the value a[k] is a maximum of "+1", if q[k] is "1" as well as q[k-1] and q[k-2], and is a minimum of "-1", if q[k] is "0" as well as q[k-1] and q[k-2]. It has to be noted that a[k] is substracted by the delta element of the delta-sigma modulator from samples x[k].

Figure 5:
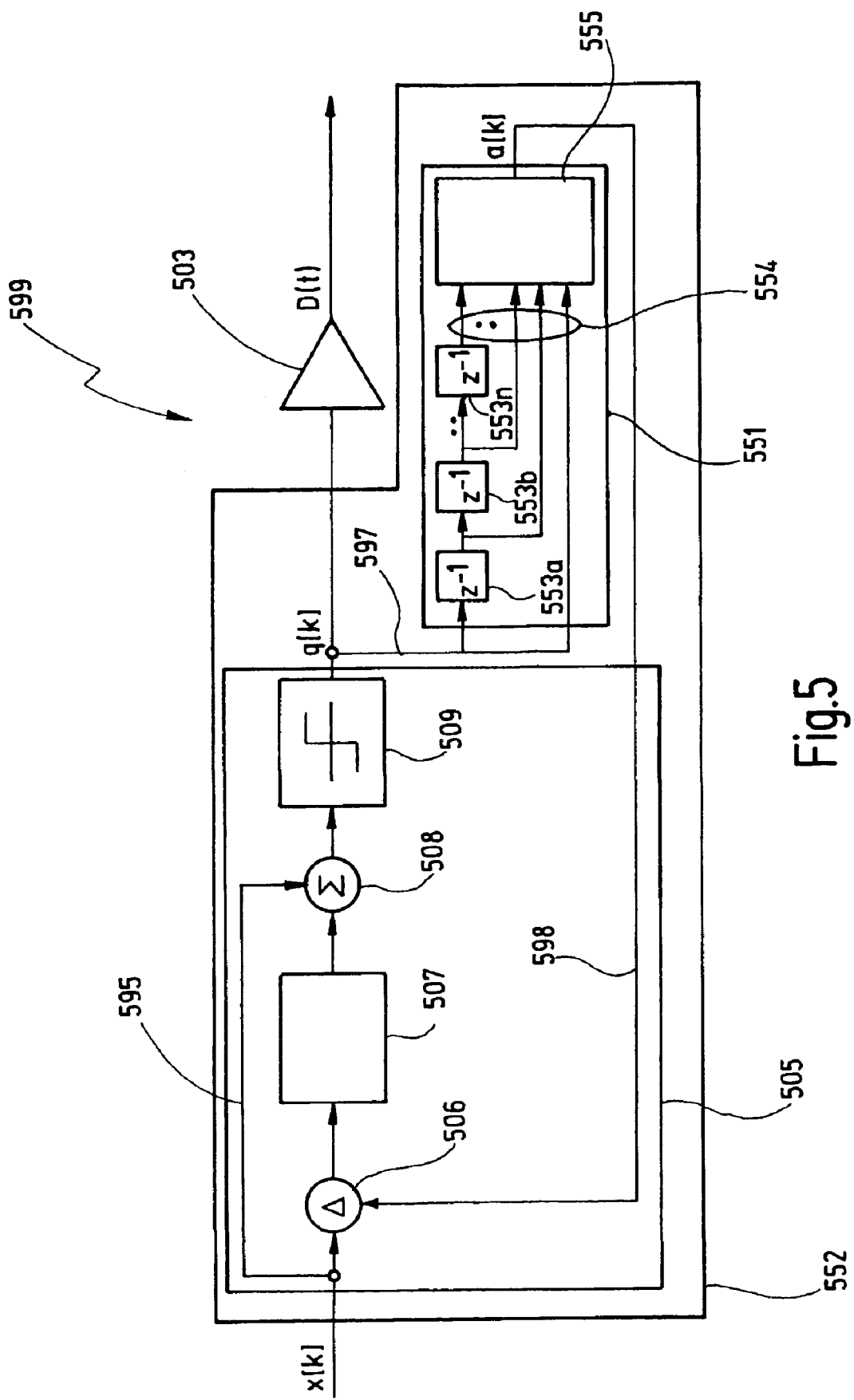
FIG. 5 shows a first embodiment of a single-bit delta-sigma digital-to-analog converter with compensation of the present invention.

FIG. 5 shows a first embodiment 599 of the present invention. Comparing FIG. 5 with FIG. 1 clearly shows the modification of the feedback loop. In FIG. 1 the feedback loop 96 connects the output of the quantizer 9 directly to the input of the difference amplifier element 6. In FIG. 5 the feedback loop is split into a first part 597 of the feedback loop connected to the output q[k] of the quantizer 509 and feeding this output q[k] into the inter symbol interference (ISI) driver model 551 representing the non-linear time-discrete function to be introduced in the feedback loop. The output a[k] of the inter symbol interference driver model 551 is fed into a difference amplifier element representing the delta element 506 of the delta-sigma modulator via the second part 598 of the feedback line. A feed-forward line 595 connects the input signal x[k] to the adder representing the sigma element 508 of the delta-sigma modulator. The output signal of the delta element 506 is fed into a loop filter 507. Output of the loop filter 507 is fed into the sigma element 508. The output signal q[k] of the quantizer 509 is fed into the driver 503. At the output of the driver 503 the signal D(t) is present.

Parts of the main building blocks of this first embodiment 599 are grouped showing parts of a single-bit delta-sigma modulator 505 without the inventive modification in the feedback loop, parts of the inter symbol interference (ISI) driver model 551 and the combination of these both groups forming an inventive delta-sigma modulator 552 of the first embodiment 599 of the invention.

The inter symbol interference driver model 551 comprises one-clock-period delay elements 553a, 553b, . . . 553n driven by the output q[k] of the quantizer 509 via the first part 597 of the feedback line. Output signals of the one-clock-period delay elements 553a, 553b, . . . 553n are fed via the control word lines 554 into the look-up table 555. The output a[k] of the look-up table 555 instead of the original output signal q[k] of the quantizer 509 is fed back into a difference amplifier element representing the delta element 506 of the delta-sigma modulator. Thus the feedback loop is modified such that the modeled area contribution of each bit is fed back instead of the ideal bit value. The feedback mechanism will now automatically compensate for varying area contributions. Note that in a software realization of this single-bit delta-sigma digital-to-analog converter with compensation 552 the correction requires no additional latency, which would destabilize the modulator. In a hardware realization of this single-bit delta-sigma digital-to-analog converter no additional latency will be present if the realization of the look-up-table 555 operates fast enough.

Figure 6:
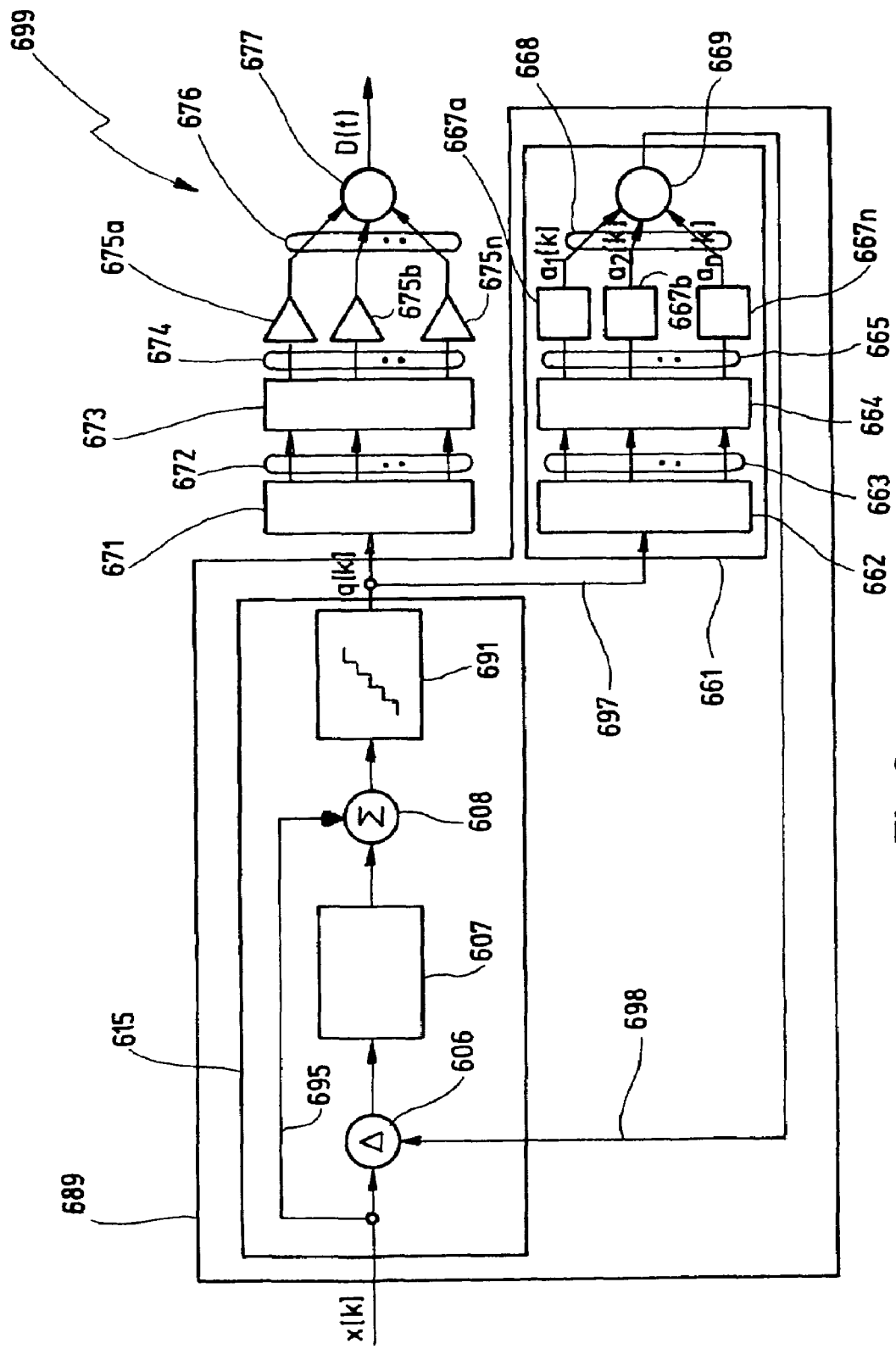
FIG. 6 shows a second embodiment of the present invention and illustrates a multi-bit delta-sigma digital-to-analog converter.

FIG. 6 shows a second embodiment of the present invention presenting a block diagram of a multi-bit delta-sigma digital-to-analog converter 699. Comparing FIG. 6 with FIG. 2 shows that the feedback line 296 shown in FIG. 2 now in FIG. 6 is split into two parts, wherein a first part 697 of the feedback line feeds the multi-bit driver inter symbol interference model 661. Output of the multi-bit driver inter symbol interference model 661 is fed via the second part 698 of the feedback line to the difference amplifier element 606. The second embodiment comprises several driver inter symbol interference models 667a, 667b . . . 667n within the multi-bit driver inter symbol interference model 661. Each of these models represent the compensation needed to compensate for non idealities of the corresponding drivers 675a, 675b, . . . 675n.

Parts of the main building blocks of this second embodiment 699 are grouped showing parts of a multi-bit delta-sigma modulator 615 without the inventive modification in the feedback loop, parts of the muti-bit inter symbol interference (ISI) driver model 661 and the combination of these both groups forming an inventive multi-bit delta-sigma modulator 689 of the second embodiment 699 of the invention.

At the top right part of FIG. 6 this embodiment comprises a decoder 671 with output lines 672 feeding a scrambler 673. Output lines 674 of the scrambler 673 are fed into the driver inputs 675a, 675b . . . 675n. The output lines 676 of the drivers 675a, 675b . . . 675n are fed into an adder 677. At the output of adder 677 the signal D(t) is present. At the lower right part of FIG. 6 a the multi-bit driver inter symbol interference model 661 comprises a decoder 662 with output lines 663 feeding a scrambler 664. Output lines 665 of the scrambler 664 are fed into the individual driver inter symbol interference (ISI) models 667a, 667b . . . 667n. Output signals a1[k], a2[k] . . . a3[k] of the individual driver inter symbol interference (ISI) models 667a, 667b . . . 667n are fed into an adder 669 using the lines 668. The output signal of adder 669 is fed into the delta element 606 using the second part 668 of the feedback line.

The multi-bit delta-sigma modulator 615 comprises a difference amplifier element 606, a loop filter 607 and an adder 608 as well as feed-forward line 695 and a multi-bit quantizer 691.

The invention claimed is:

1. A method for generating an analog signal x(t) based on samples x[k] representing said analog signal, said method comprising:

feeding said samples x[k] into a delta-sigma modulator, said delta-sigma modulator outputting a sequence of bits q[k];

feeding the sequence of bits q[k] into a chain of delay elements; feeding output signals of the delay elements to a lookup table storing combinations of arguments and values of a non-linear time-discrete function;

using the lookup table to determine a value of the non-linear time-discrete function in response to the output signals of the delay elements; and providing the value as feedback to a delta element of the delta-sigma modulator, wherein said non-linear time-discrete function represents a model for non-idealities of at least one digital driver at the output of said delta-sigma modulator.

2. The method of claim 1, wherein said non-linear time-discrete function is determined by an initial step resulting in initial values of said non-linear time-discrete function, and an optimizing step varying said initial values to minimize deviations of said generated analog signal x(t) from a corresponding ideal signal.

3. The method of claim 1, wherein said delta-sigma modulator is a multi-bit delta-sigma modulator followed by a decoder and a scrambler.

4. The method of claim 3, wherein said multi-bit delta-sigma modulator comprises a plurality of drivers, and in that for at least two of the drivers, an individual non-linear, time-discrete function is introduced into said feedback loop.

5. The method of claim 1, wherein said delta-sigma modulator is a band-pass delta-sigma modulator and is followed by a band-pass filter thus forming a band-pass delta-sigma digital-to-analog converter.

6. The method of claim 1, wherein said generated analog signal x(t) is provided by an Automated Test Equipment as an input signal for a Device Under Test.

7. A recordable medium, readable by a computer, on which a program is stored for executing the method of claim 1 when running on a data processing system.

8. A system for generating an analog signal x(t) based on samples x[k] representing said analog signal, said system comprising:

a delta-sigma modulator outputting a sequence of bits q[k] in response to said samples x[k]

a chain of delay elements driven by the sequence of bits q[k];

a lookup table connected to outputs of the delay elements, the lookup table storing combinations of arguments and values of a non-linear time-discrete function and operable to determine a value of the non-linear time-discrete function in response to the outputs of the delay elements; and a delta element of the delta-sigma modulator for receiving the value of the non-linear time-discrete function as feedback, wherein said non-linear time-discrete function represents a model for non-idealities of at least one digital driver at the output of said delta-sigma modulator.

* * * * *